(12) United States Patent
Matsui et al.

(10) Patent No.: US 8,697,319 B2
(45) Date of Patent: Apr. 15, 2014

(54) EXPOSURE METHOD, COLOR FILTER MANUFACTURING METHOD, AND EXPOSURE DEVICE

(75) Inventors: Kohei Matsui, Tokyo (JP); Yasuhiro Shibata, Tokyo (JP); Ryosuke Yasui, Tokyo (JP)

(73) Assignee: Toppan Printing Co., Ltd., Tokyo (JP)

( * ) Notice: Subject to any disclaimer, the term of this patent is extended or adjusted under 35 U.S.C. 154(b) by 293 days.

(21) Appl. No.: 13/138,340

(22) PCT Filed: Feb. 4, 2010

(86) PCT No.: PCT/JP2010/000663
§ 371 (c)(1),
(2), (4) Date: Sep. 22, 2011

(87) PCT Pub. No.: WO2010/090018
PCT Pub. Date: Aug. 12, 2010

(65) Prior Publication Data
US 2012/0008120 A1    Jan. 12, 2012

(30) Foreign Application Priority Data
Feb. 5, 2009    (JP) .................................. 2009-024649

(51) Int. Cl.
*G02B 5/20* (2006.01)
*G03F 7/20* (2006.01)

(52) U.S. Cl.
USPC .................................. 430/7; 430/394; 355/67

(58) Field of Classification Search
None
See application file for complete search history.

(56) References Cited

U.S. PATENT DOCUMENTS

2004/0009431 A1    1/2004    Amo et al.

FOREIGN PATENT DOCUMENTS

| JP | 1-234850 | 9/1989 |
|---|---|---|
| JP | 11-186160 | 7/1999 |
| JP | 2004-47687 | 2/2004 |
| JP | 2006-17895 | 1/2006 |
| JP | 2006-292955 | 10/2006 |
| JP | 2008-9158 | 1/2008 |
| JP | 2008-224754 | 9/2008 |
| WO | 2006/003863 A1 | 1/2006 |

OTHER PUBLICATIONS

International Search Report for PCT/JP2010/000663, Mailed Mar. 16, 2010.
Korean Office Action issued Dec. 21, 2012, in corresponding Korean Patent Application No. 2011-7019543.

*Primary Examiner* — John A. McPherson

(57) ABSTRACT

An exposure method is provided, in which when exposure is performed using a photomask having a plurality of mask patterns, various mask patterns corresponding to various different color filters are exposed in different regions on a substrate, without moving the photomask to an irradiation area in an exposure device. A photomask, having a first mask pattern for exposing a portion of colored pixels constituting a first color filter and a second mask pattern for exposing a portion of colored pixels constituting a second color filter, is fixed with respect to a light source. A light beam from a light source is selectively directed to the first mask pattern while transferring the substrate, to continuously expose a resist in a first region, and the light beam from the light source is selectively directed to the second mask pattern while transferring the substrate, to continuously expose a resist in a second region.

5 Claims, 16 Drawing Sheets

FIG.2
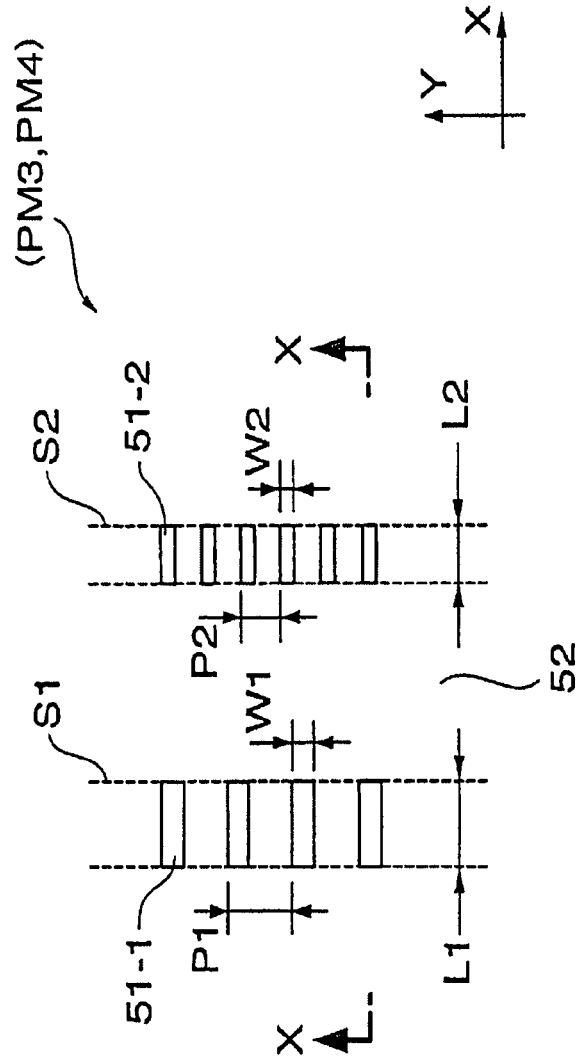
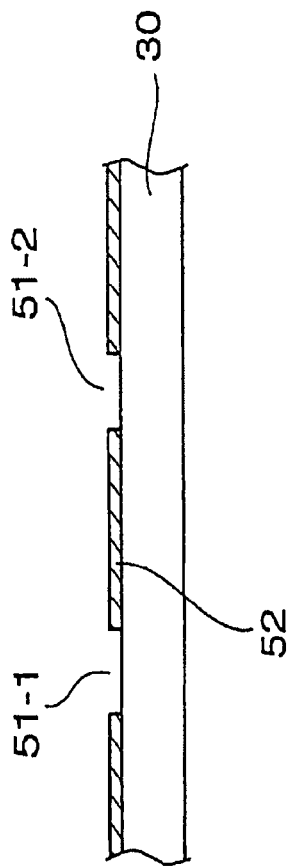

EXPOSURE METHOD, COLOR FILTER MANUFACTURING METHOD, AND EXPOSURE DEVICE

CROSS REFERENCE TO RELATED APPLICATIONS

This application is a national phase application, under 35 U.S.C. 371, of international application No. PCT/JP2010/000663, filed on Feb. 4, 2010, which claimed priority to Japanese Patent Application No. 2009-024649, filed on Feb. 5, 2009, the disclosures of which are incorporated herein by reference.

TECHNICAL FIELD

The present invention relates to an exposure method for color filters which are used in, for example, liquid crystal display devices, and an exposure device used for the exposure method.

BACKGROUND ART

In display devices such as liquid crystal display devices, color filters are widely used for the purposes of color image display, reflectance reduction, contrast adjustment, spectral characteristic control, and the like. A color filter is formed by arranging colored pixels in a matrix on a substrate. Methods for forming such colored pixels on a substrate include, for example, printing and photolithography.

FIG. 7 is an enlarged view of pixels of a color filter, and FIG. 8 is a cross-sectional view of the pixels, taken along a line X-X in FIG. 7.

The color filter shown in FIGS. 7 and 8 includes a substrate 50, a lattice-shaped black matrix 21 formed on the substrate 50, colored pixels 22, and a transparent conductive film 23. The black matrix 21 has a light-shielding property, defines the positions of the colored pixels 22 on the substrate 50, and makes the size of the colored pixels 22 uniform. In addition, when the color filter is used in a display device, the black matrix 21 blocks unnecessary light to achieve a high-contrast, even, and uniform image quality. The colored pixels 22 function as a filter for reproducing various colors.

A color filter is formed as follows. Firstly, a black photoresist is applied to the substrate 50, and exposed to light through a photomask and then developed, thereby forming a black matrix 21. Next, a color resist is applied to the substrate 50, and exposed to light through a photomask and then developed, thereby forming colored pixels 22. The process of forming colored pixels 22 is repeated until colored pixels 22 of all colors are formed on the substrate. Further, ITO (Indium Tin Oxide) is deposited by sputtering over the entire surface of the substrate 50 so as to cover the black matrix 21 and the colored pixels 22, thereby forming a transparent conductive film 23.

In mass production of the above-described color filter, it is general to form an array of a plurality of color filters on a single large substrate. For example, four color filters each having a diagonal of 17 inches can be formed on a glass substrate having a size of about 650 mm×850 mm.

As described above, in order to form a plurality of color filters on a single substrate, exposure has been popularly performed by using a photomask of approximately the same size as the substrate, on which a plurality of mask patterns corresponding to all the color filters are formed (for example, in the above-described example, a photomask on which four mask patterns corresponding to color filters each having a diagonal of 17 inches are formed). According to this method, patterns corresponding to all the mask patterns on the photomask are simultaneously formed on the substrate by a single exposure (so-called one-shot exposure).

However, the size of the photomask is increased with an increase in the size of the color filter. Thereby, the manufacturing cost of the photomask increases, and moreover, a problem of deflection of the photomask may occur due to its own weight at the time of exposure.

So, in order to resolve the problems of high cost and deflection due to an increase in the size of the photomask, an exposure method has been adopted, in which a plurality of exposures are performed by using a single photomask capable of simultaneously exposing a plurality of color filters, while changing the position of the photomask opposed to a substrate. For example, when the size of the substrate became about 730 mm×920 mm (the fourth generation), a single-axis step exposure method was adopted, in which exposure is repeated with the substrate being moved in steps along one direction with respect to a photomask. When the size of the glass substrate became about 1000 mm×1200 mm (the fifth generation), an XY (two-axis) step exposure method (step and repeat method) was adopted, in which exposure is repeated with the substrate being moved in steps along two directions with respect to a photomask.

FIG. 9 is a plan view illustrating an example of manufacturing of color filters by the XY step exposure method.

On a substrate 50, first to sixth exposure regions 1Ex to 6Ex are provided, in which six (two rows×three columns) color filters are to be exposed. The substrate 50 is placed on an exposure stage 60, and is freely movable in the X and Y directions.

Firstly, exposure is performed with a photomask PM being overlapped with the first exposure region 1Ex to form a mask pattern of the photomask PM in the first exposure region 1Ex. Thereafter, the substrate 50 is moved by a distance Py in the positive direction of the Y axis to overlap the photomask PM with the second exposure region 2Ex, and a pattern of the photomask PM is formed in the second exposure region 2Ex. Next, the substrate 50 is moved by a distance Px in the positive direction of the X-axis to overlap the photomask PM with the third exposure region 3Ex, and a pattern of the photomask PM is formed in the third exposure region 3Ex. Thereafter, in a similar manner to above, exposure is repeated with the substrate 50 being moved in the X direction or the Y direction, thereby forming patterns in the fourth to sixth exposure regions 4Ex to 6Ex.

The use of the XY 2-axis step exposure method resolves the problem of an increase in manufacturing cost due to an increase in the size of the photomask, and the problem of deflection of the photomask due to its own weight. However, if the size of the substrate is further increased (for example, about 1500 mm×1800 mm (the sixth generation) or about 2100 mm×2400 mm (the eighth generation)), the color filters themselves formed on the substrate are also increased in size, which eventually causes an increase in the size of the photomask. As a result, the problems of high cost and deflection of the photomask occur again.

So, an exposure method is attempted, in which exposure is continuously performed by using a photomask smaller than a single color filter, while transferring a substrate.

FIG. 10 is a plan view illustrating a slit exposure method. FIG. 11 is a cross-sectional view taken along a line X-X in FIG. 10. FIG. 12 is a partially enlarged view of a mask pattern of a photomask shown in FIG. 10. FIG. 13 is a partially enlarged view of stripe patterns exposed by the slit exposure method. In FIG. 11, part (a) shows a state where exposure of a first exposure region is started, and part (b) shows a state where exposure of the first exposure region is completed.

As shown in FIGS. 10 and 11, in the slit exposure method, a photomask PM2, which is smaller in size than a first exposure region 1Ex of a substrate 50 placed on an exposure stage 60, is disposed between the substrate 50 and a light source (not shown). The exposure stage 60 is movable at a constant speed in the horizontal direction of the figure, and further, is movable in steps in the vertical direction of the figure along the Y axis. As shown in FIG. 12, the photomask PM2 has a slit S for exposing a portion of a pattern formed in the first exposure region 1Ex. In the longitudinal direction Ls of the slit S, a plurality of openings 51 are aligned at predetermined intervals Pi. The width and length of each opening 51 are Wi and Li, respectively.

When exposing the first exposure region 1Ex, as shown in FIGS. 10 and 11(a), the photomask PM2 is placed on the left end of the first exposure region 1Ex. Then, while irradiating the photomask PM2 with a light beam from the light source, the substrate 50 is continuously transferred leftward in FIG. 10 along the X axis, until reaching the state shown in FIG. 11(b). As a result, as shown in FIG. 13, stripe patterns each having a width Wi and an interval Pi are formed, on the substrate 50, extending in the substrate transfer direction (the horizontal direction of FIG. 10).

After the exposure of the first exposure region, the exposure stage 60 is moved by a distance Py in the positive direction of the Y axis in FIG. 10 to align the photomask PM2 to an exposure start position in the second exposure region. Then, stripe patterns are formed in the second exposure region by performing continuous exposure similar to that performed on the first exposure region.

Thus, the slit exposure method realizes large-area exposure as well as a size reduction of the photomask.

FIG. 14 is a partially enlarged view of a color filter manufactured by the slit exposure method.

In the color filter shown in FIG. 14, stripe colored patterns extending in the X direction are formed on a glass substrate on which a lattice-shaped black matrix 21 is formed, thereby forming red colored pixels 22R, green colored pixels 22G and blue colored pixels 22B. In the Y-axis direction, a set of red, green, and blue colored pixel lines is repeatedly formed at a pitch Pi.

The patterns formed by the slit exposure method are limited to stripe patterns that are continuous in the substrate transfer direction (X direction in FIG. 14). Therefore, the slit exposure method is not applicable to formation of nonlinear patterns such as rectangle colored pixels or cylindrical spacers. As a method similar to the slit exposure method, a pulsed light exposure method has been proposed, in which nonlinear patterns are formed by intermittently emitting a light beam from a light source (by repeating turn-on and turn-off of the light source) (refer to Patent Literature 1, for example).

The pulsed light exposure method is fundamentally identical to the slit exposure method described with reference to FIGS. 10 and 11. However, in the pulsed light exposure method, instead of continuously emitting a light beam from the light source, a light beam is emitted from the light source at an instant when a pattern formation region on a moving substrate passes beneath an opening of a photomask. By repeating the instantaneous light emission at predetermined intervals, a plurality of mask patterns are intermittently printed. Since the light-emission time per pulse is about several tens of microseconds, an exposure deviation, which is caused by that the substrate moves during irradiation, falls within an allowable range.

FIG. 15 is a partially enlarged view of a color filter manufactured by the pulsed light exposure method.

In the color filter shown in FIG. 15, rectangle colored patterns are formed on a substrate on which a black matrix 21 is formed, thereby forming red colored pixels 22R', green colored pixels 22G', and blue colored pixels 22B'. The width and length of each colored pixel are Wi and Li, respectively. The rectangle colored pixels of each color are formed at an equal pitch Pi-2, discontinuously in the X-axis direction. In the Y-axis direction, lines of colored pixels are repeatedly aligned in order of red, green, and blue at an equal pitch Pi. In the X-axis direction, the respective colored pixels are repeatedly arranged at the pitch Pi-2. In the Y-axis direction, a set of adjacent colored pixel lines of red, green, and blue is repeatedly arranged at the pitch Pi.

FIG. 16 is a plan view illustrating an example of a plurality of types of color filters formed on the same substrate.

While in the above description a plurality of color filters of the same type are formed on a single substrate, there are cases where a plurality of color filters of different types are formed on a single substrate. In the example of FIG. 16, four color filters CF-A and three color filters CF-B are formed, and the color filters CF-B are different from the color filters CF-A in the size of colored pixels or in the finished size of color filters. By adopting a method of forming a plurality of color filters of different types together on a single substrate, a blank space (a region indicated by "B"), which is generated when a plurality of color filters CF-A are formed in a region indicated by "A" in FIG. 16, can be filled with color filters CF-B smaller than the color filters CF-A. Such an effective use of the blank space enables a reduction in manufacturing cost per color filter. Moreover, supply of a plurality of color filters of different types can be started in a short time.

CITATION LIST

Patent Literature

[Patent Literature 1] Japanese Laid-Open Patent Publication No. 11-186160
[Patent Literature 2] Japanese Laid-Open Patent Publication No. 2006-292955
[Patent Literature 3] Japanese Laid-Open Patent Publication No. 2006-17895
[Patent Literature 4] Japanese Laid-Open Patent Publication No. 2008-09158

SUMMARY OF THE INVENTION

Problems to be Solved by the Invention

As in the example shown in FIG. 16, when forming two different types of color filters on a single substrate by the slit exposure method (FIGS. 10 to 13) or the pulsed light exposure method, it is considered, as a first method, that a photomask A (mask pattern A) for exposing the color filters CF-A and a photomask B (mask pattern B) for exposing the color filters CF-B are prepared, and a first exposure using the photomask A and a second exposure using the photomask B are performed. In this case, however, two photomasks are required, which makes it hard to say that color filters can be manufactured inexpensively by the first method.

Further, it is considered, as a second method, that both a mask pattern A and a mask pattern B are formed in a single photomask, and a mask pattern to be used is selected in accordance with an exposure target region.

However, the irradiation range in which a light beam from the light source can be directed to the photomask is made constant in the exposure device. Accordingly, when the second method is adopted, the position of the photomask is adjusted so that the mask pattern A enters the irradiation range and then the first exposure is performed. Thereafter, the position of the photomask is adjusted so that the mask pattern B enters the irradiation range and then the second exposure is performed. Further, when starting the first exposure (second exposure), positioning of the mask pattern must be performed with respect to the exposure region on the substrate. That is, in the second method, the positional adjustment of the photomask with respect to the irradiation range of the light beam from the light source and the positioning of the photomask with respect to the substrate must be performed each two times. Although the second method has the advantage that only one photomask is needed, considerable time is required for positioning of the photomask, which leads to a reduction in production efficiency.

Accordingly, when forming a plurality of types of color filters on a single substrate, the above-described first and second methods are not efficient manufacturing methods.

Therefore, an object of the present invention is to provide an exposure method, a color filter manufacturing method, and an exposure device, which are capable of efficiently forming a plurality of types of color filters on a single substrate while adopting an exposure method using a compact photomask.

Solution to the Problems

The present invention is directed to an exposure method for forming different resist patterns in a first region and a second region on a single substrate. The exposure method includes: fixing a photomask with respect to a light source, the photomask having a first mask pattern for exposing a portion of the resist pattern in the first region, and a second mask pattern for exposing a portion of the resist pattern in the second region; continuously or intermittently exposing the resist in the first region by selectively directing a light beam from the light source to the first mask pattern, while transferring the substrate; and continuously or intermittently exposing the resist in the second region by selectively directing the light beam from the light source to the second mask pattern, while transferring the substrate.

Further, the present invention is directed to a color filter manufacturing method for forming different color filters in a first region and a second region on a single substrate. The color filter manufacturing method includes: fixing a photomask with respect to a light source, the photomask having a first mask pattern for exposing a portion of colored pixels in the first region, and a second mask pattern for exposing a portion of colored pixels in the second region; and forming colored pixels of all colors, which constitute the color filters, by repeatedly performing a colored pattern formation process including: a step of applying a color resist on the substrate; a step of continuously or intermittently exposing the color resist in the first region by selectively directing a light beam from the light source to the first mask pattern while transferring the substrate; and a step of continuously or intermittently exposing the color resist in the second region by selectively directing the light beam from the light source to the second mask pattern while transferring the substrate.

Further, the present invention is directed to an exposure device for forming different resist patterns in a first region and a second region on a single substrate. The exposure device includes: a light source; a photomask fixed with respect to the light source, the photomask having a first mask pattern for exposing a portion of the resist pattern in the first region, and a second mask pattern for exposing a portion of the resist pattern in the second region; a substrate transfer device for transferring a substrate on which a resist is applied; and a selective irradiation mechanism for selectively directing a light beam from the light source to either of the mask patterns of the photomask.

Effects of the Invention

According to the present invention, different mask patterns can be formed in the first and second regions on the substrate, respectively, without changing the position of the photomask with respect to the exposure device when selecting any of the plurality of mask patterns provided in the photomask.

BRIEF DESCRIPTION OF THE DRAWINGS

FIG. 2 is a diagram illustrating a photomask for exposing the two types of color filters shown in FIG. 1.

EMBODIMENTS FOR CARRYING OUT THE INVENTION

Figure 1:
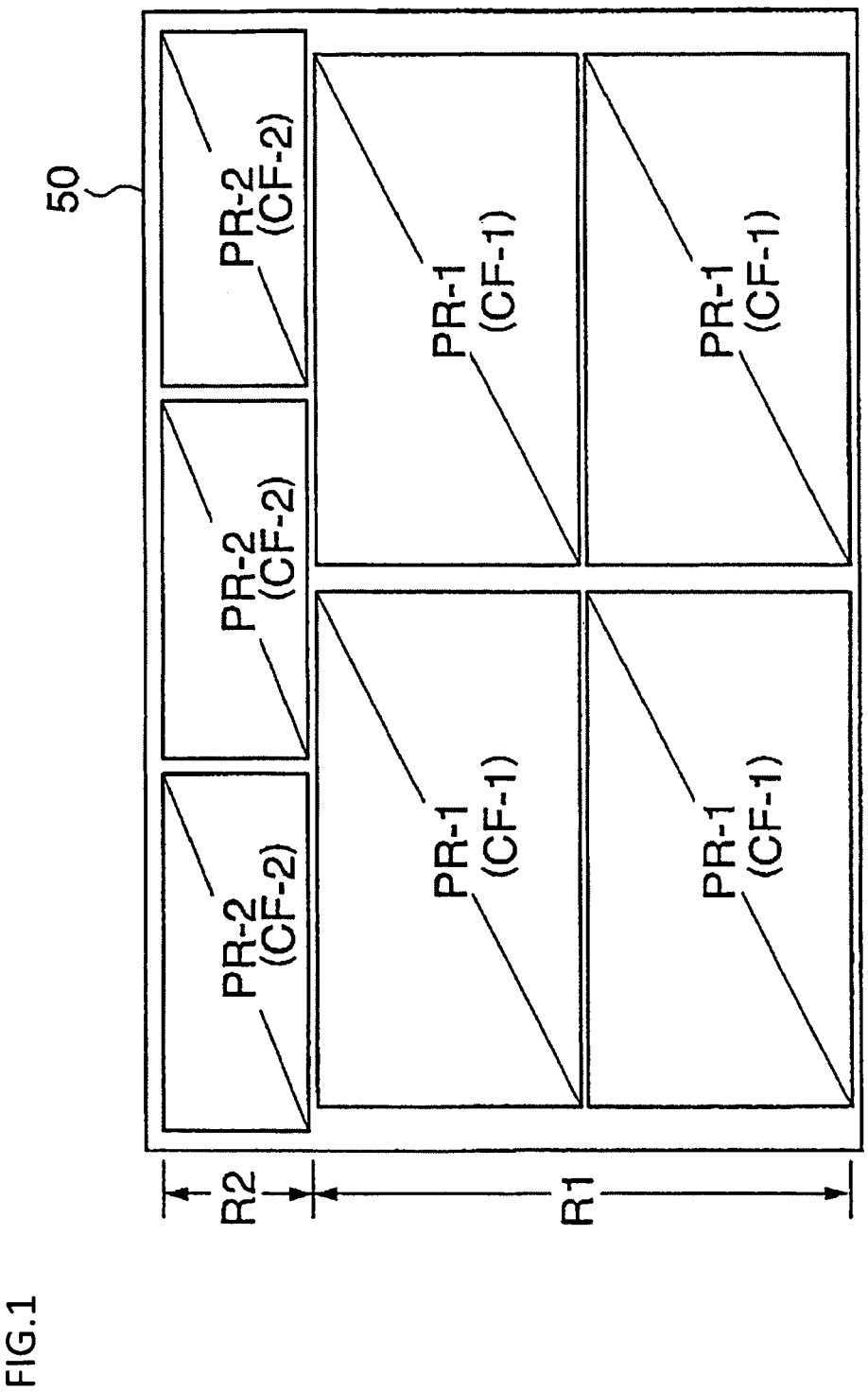
FIG. 1 is a plan view illustrating an example in which two different types of color filters are formed on a single substrate.

FIG. 1 is a plan view illustrating an example in which two different types of color filters are formed on a single substrate.

An exposure method of the present invention is for forming a plurality of different types of color filters on a substrate by using a single photomask. Here, the "plurality of different types of color filters" means color filters which are different in at least one of the size and arrangement pitch of colored pixels, and the finished size.

For example, as shown in FIG. 1, two different types of color filters are formed on a single substrate. Specifically, four first color filters CF-1 are formed in a region R1 on a substrate, and three second color filters CF-2 are formed in a region R2 on the same substrate.

FIG. 2 is a diagram illustrating a photomask for exposing the two types of color filters shown in FIG. 1. Here, FIG. 2(a) is a plan view of the photomask, and FIG. 2(b) is a cross-sectional view of the photomask, taken along a line X-X in FIG. 2(a).

As shown in FIG. 2(a), a photomask PM3 (PM4) has a first slit S1 as a mask pattern for exposing the first color filters CF-1, and a second slit S2 as a mask pattern for exposing the second color filters CF-2. The first slit S1 is configured by a light-blocking layer 52, and an array of a plurality of openings 51-1 which are formed by partially removing the light-blocking layer 52 on a mask substrate 30. Likewise, the second slit S2 is configured by the light-blocking layer 52, and an array of a plurality of openings 51-2 which are formed by partially removing the light-blocking layer 52 on the mask substrate 30. The width, length, and arrangement pitch of the openings 51-1 are W1, L1, and P1, respectively. The width, length, and arrangement pitch of the openings 51-2 are W2, L2, and P2, respectively. The first slit S1 and the second slit S2 are different from each other in the width, length, and arrangement pitch of the openings, and W1>W2, L1>L2, and P1>P2.

In FIG. 1, a first region PR-1 is a region in which stripe or dot patterns are formed by the first slit S1, and a second region PR-2 is a region in which stripe or dot patterns are formed by the second slit S2.

Hereinafter, exposure methods according to first and second embodiments will be described with reference to FIGS. 1 to 4.

First Embodiment

Figure 3:
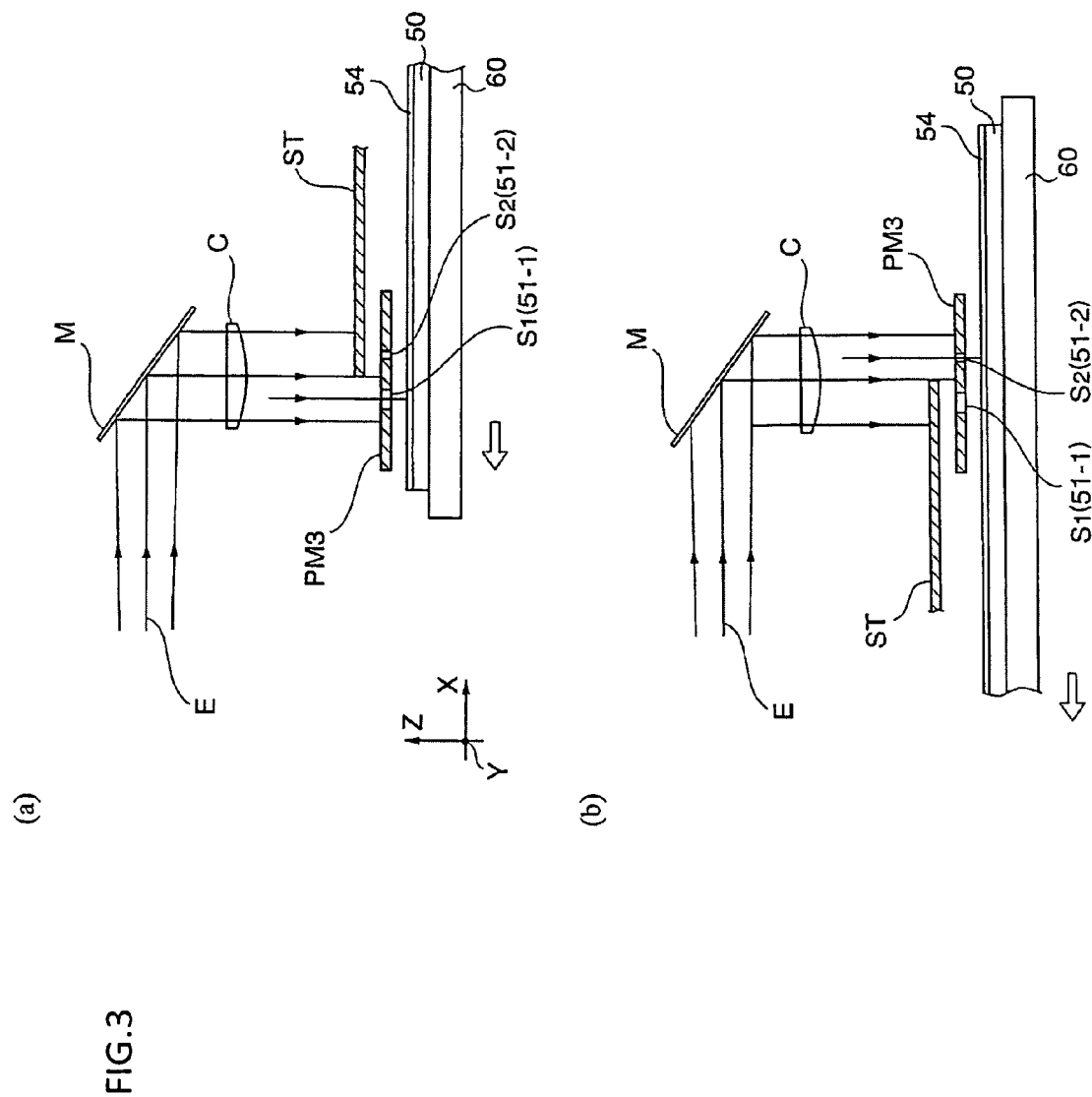
FIG. 3 is a schematic diagram illustrating an exposure device according to a first embodiment.

FIG. 3 is a schematic diagram illustrating an exposure device according to the first embodiment. More specifically, FIG. 3(a) is a diagram illustrating a state where colored pixels of the first color filter are exposed, and FIG. 3(b) is a diagram illustrating a state where colored pixels of the second color filter are exposed.

The exposure device shown in FIG. 3 is used for exposing different color filters in the first region PR-1 and the second region PR-2 on the single substrate 50. The exposure device includes: a light source (not shown); a photomask PM3 which is placed opposed to the substrate 50 and is fixed with respect to the light source; a substrate transfer device 60 for continuously transferring the substrate 50 on which a resist 54 is applied, in the direction indicated by an outlined arrow; a mirror M for bending a light beam E emitted from the light source; a collimator lens C for converting the light beam bent by the mirror M into a parallel light beam; and a shutter ST which functions as a selective irradiation mechanism for selectively directing the light beam to an arbitrary mask pattern of the photomask PM3. The shutter ST is supported movably in the X-axis direction in the figure by a movement mechanism (not shown).

The parallel light beam emitted from the collimator lens C is directed to a region including both the first slit S1 and the second slit S2 of the photomask PM3. However, the shutter ST shields, from light, either the first slit S1 or the second slit S2 of the photomask PM3, and thereby the light beam is selectively directed to either the first slit S1 or the second slit S2. Specifically, as shown in FIG. 3(a), when the shutter ST covers the second slit S2, the light beam is directed to the resist 54 through the openings 51-1 of the first slit S1. As shown in FIG. 3(b), when the shutter ST covers the first slit S1, the light beam is directed to the resist 54 through the openings 51-2 of the second slit S2.

Hereinafter, a color filter manufacturing method according to the present embodiment will be described.

Firstly, a color resist 54 of a first color (e.g., red) is applied to a substrate 50 on which a black matrix and a metal wiring (both not shown) are formed, and the substrate 50 is placed on the substrate transfer device 60. Next, the position of the first slit S1 is aligned to an exposure start position in the first region PR-1 on the substrate 50. At this time, as shown in FIG. 3(a), the shutter ST covers the second slit S2. In this state, the substrate 50 is continuously transferred by the substrate transfer device 60 in the direction indicated by the outlined arrow shown in FIG. 3 while selectively directing a light beam from the light source to the first slit S1. Further, the substrate 50 is moved in steps in the Y-axis direction, and exposure is performed to the first region PR-1 in another row. As a result, stripe colored patterns constituting the first color filter are formed in the four first regions PR-1 shown in FIG. 1.

Next, the position of the second slit S2 is aligned to an exposure start position in the second region PR-2 on the substrate 50. At this time, as shown in FIG. 3(b), the shutter ST covers the first slit S1 from the light beam. In this state, the substrate 50 is continuously transferred by the substrate transfer device 60 in the direction indicated by the outlined arrow shown in FIG. 3 while selectively directing the light beam from the light source to the second slit S2. As a result, stripe colored patterns constituting the second color filter are formed in the three second regions PR-2 shown in FIG. 1.

The above-described exposure of the colored pixels in the first region PR-1 and the second region PR-2 is repeatedly performed for all colors (e.g., red, blue, and green) constituting the color filters. Thus, the colored pixels constituting the first color filter CF-1 are formed in the first region PR-1 of the substrate 50, and the colored pixels constituting the second color filter CF-2 are formed in the second region PR-2.

As described above, in the exposure device according to the present embodiment, it is possible to selectively direct a light beam to either of the mask patterns (slits) by moving the shutter ST, without changing the positional relation between the photomask PM3 and the irradiation range of the light beam from the light source. As a result, in contrast to the conventional art, it is not necessary to perform positioning of the mask pattern with respect to the irradiation range of the light beam from the light source, and only two times of alignment are needed (that is, positioning of the mask pattern to the exposure start position in the region R1, and positioning of the mask pattern to the exposure start position in the region R2). Accordingly, in the present invention, even when a plurality of color filters of different sizes are formed on a single substrate, the number of times of positioning can be reduced to efficiently form color filters.

Second Embodiment

Figure 4:
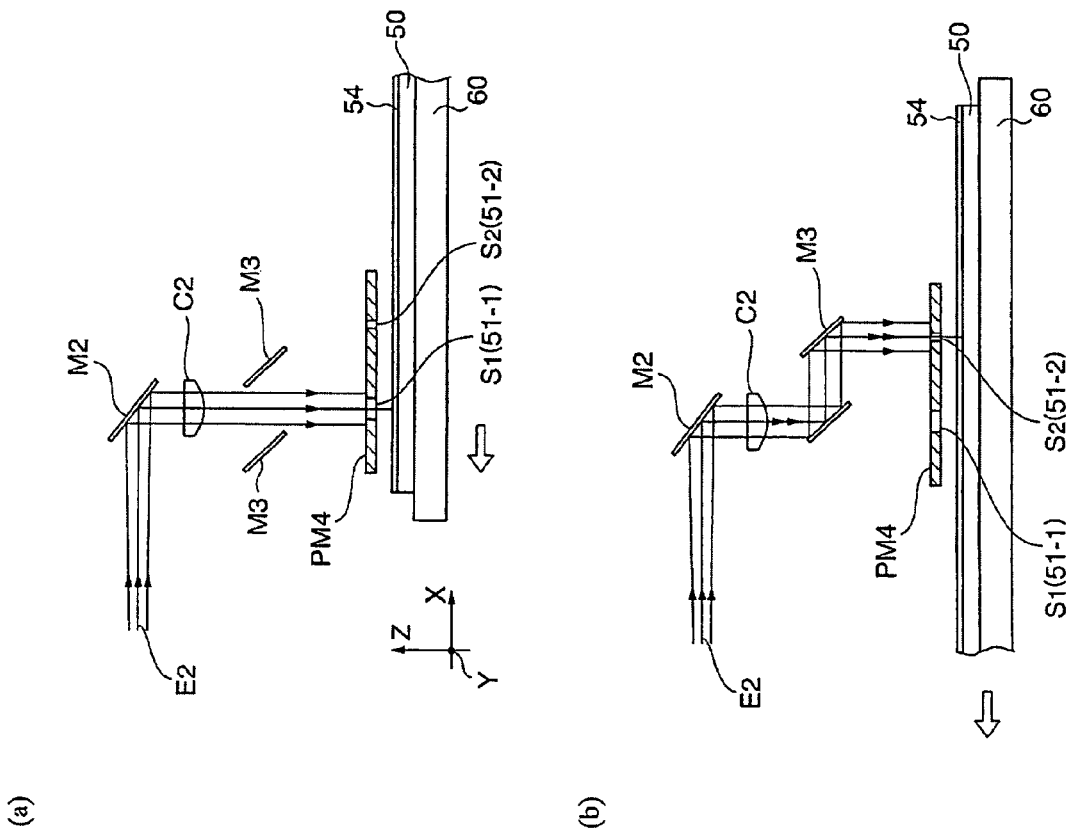
FIG. 4 is a schematic diagram illustrating an exposure device according to a second embodiment.

FIG. 4 is a schematic diagram illustrating an exposure device according to the second embodiment. The exposure device of the second embodiment is different from the first embodiment in the selective irradiation mechanism. Here, descriptions of the same components as those of the first embodiment will be omitted.

The exposure device shown in FIG. 4 includes: a light source (not shown); a photomask PM4 which is placed opposed to the substrate 50 and is fixed with respect to the light source; a substrate transfer device 60 for continuously transferring the substrate 50 on which a resist 54 is applied, in the direction indicated by an outlined arrow; a mirror M2 for bending a light beam E emitted from the light source; a collimator lens C2 for converting the light beam bent by the mirror M2 into a parallel light beam; and a pair of mirrors M3 placed between the collimator lens C2 and the photomask PM4.

The pair of mirrors M3 are plate mirrors, and are placed opposed to each other so that the mirror surfaces thereof are parallel to each other. The mirror surface of each mirror M3 is inclined at an angle of 45 degrees with respect to the optical axis of the collimator lens C2. Further, the pair of mirrors M3 are supported by a movement mechanism (not shown) so as to be movable in the X-axis direction.

In the present embodiment, the irradiation range of the light beam emitted from the collimator lens C2 is large enough to cover either of the first slit S1 and the second slit S2. In the first state (FIG. 4(a)) where the first slit S1 is selected, both the mirrors M3 are located in positions outside the light path of the light beam emitted from the collimator lens C2. On the other hand, in the second state (FIG. 4(b)) where the second slit S2 is selected, the mirrors M3 are moved in the X-axis direction in FIG. 4 by a movement mechanism (not shown), and one of the mirrors M3 (the mirror whose mirror surface faces obliquely upward) intersects with the light path of the collimator lens C2 to bend the light beam emitted from the collimator lens C2 in the X-axis positive direction. The bent light beam is again bent at 90 degrees by the other mirror M3 to be directed to the second slit S2. In this way, in the present embodiment, the pair of mirrors M3, which are movable in parallel with the photomask PM4, function as the selective irradiation mechanism for selectively directing a light beam to an arbitrary mask pattern on the photomask PM4.

Since an exposure method and a color filter manufacturing method, which use the exposure device of the present embodiment, are identical to those of the first embodiment, repeated description is not necessary.

As described above, in the exposure device of the present embodiment, it is possible to selectively direct a light beam to either of the mask patterns (slits) by moving the shutter ST, without changing the positional relation between the photomask PM3 and the irradiation range of the light beam from the light source. As a result, in contrast to the conventional art, it is not necessary to perform positioning of the mask pattern with respect to the irradiation range of the light beam from the light source, and only two times of alignment are needed (that is, positioning of the mask pattern to the exposure start position in the region R1, and positioning of the mask pattern to the exposure start position in the region R2). Accordingly, in the present invention, the number of times of positioning can be reduced to efficiently form color filters.

Third Embodiment

Figure 5:
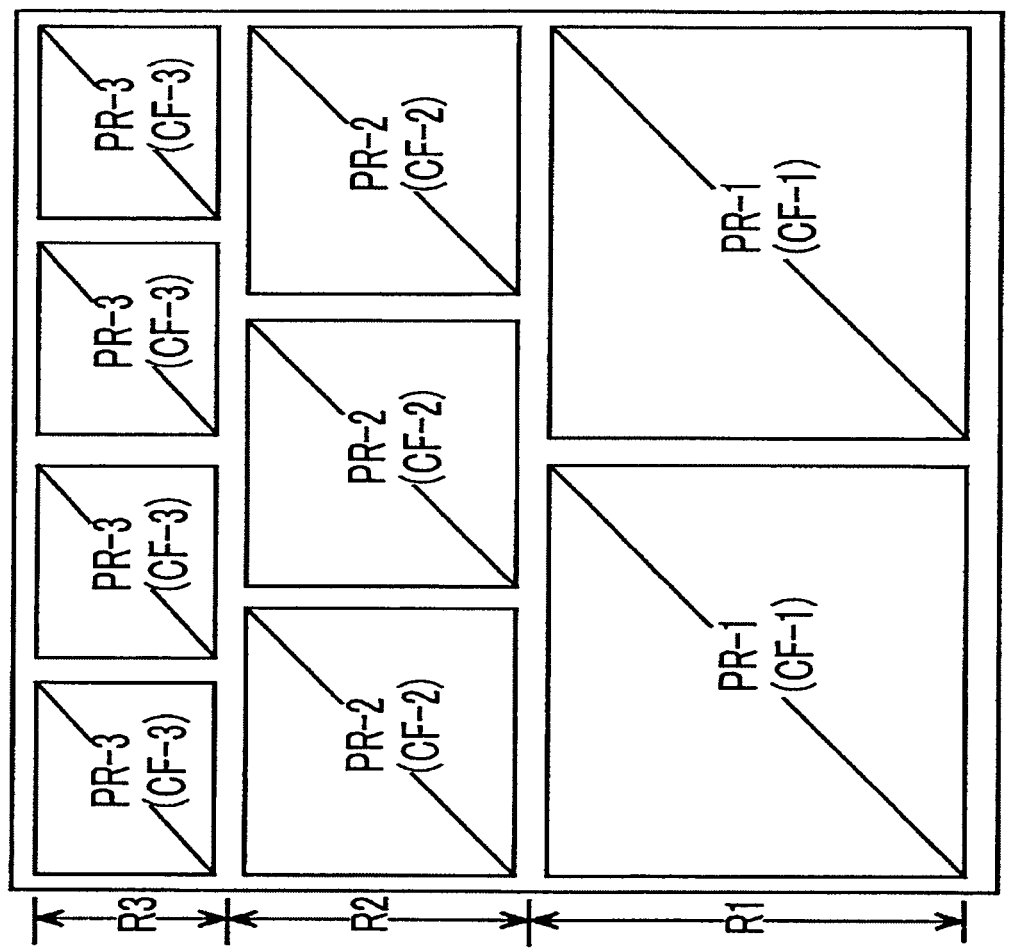
FIG. 5 is a plan view illustrating an example in which three different types of color filters are formed on a single substrate.
Figure 6:
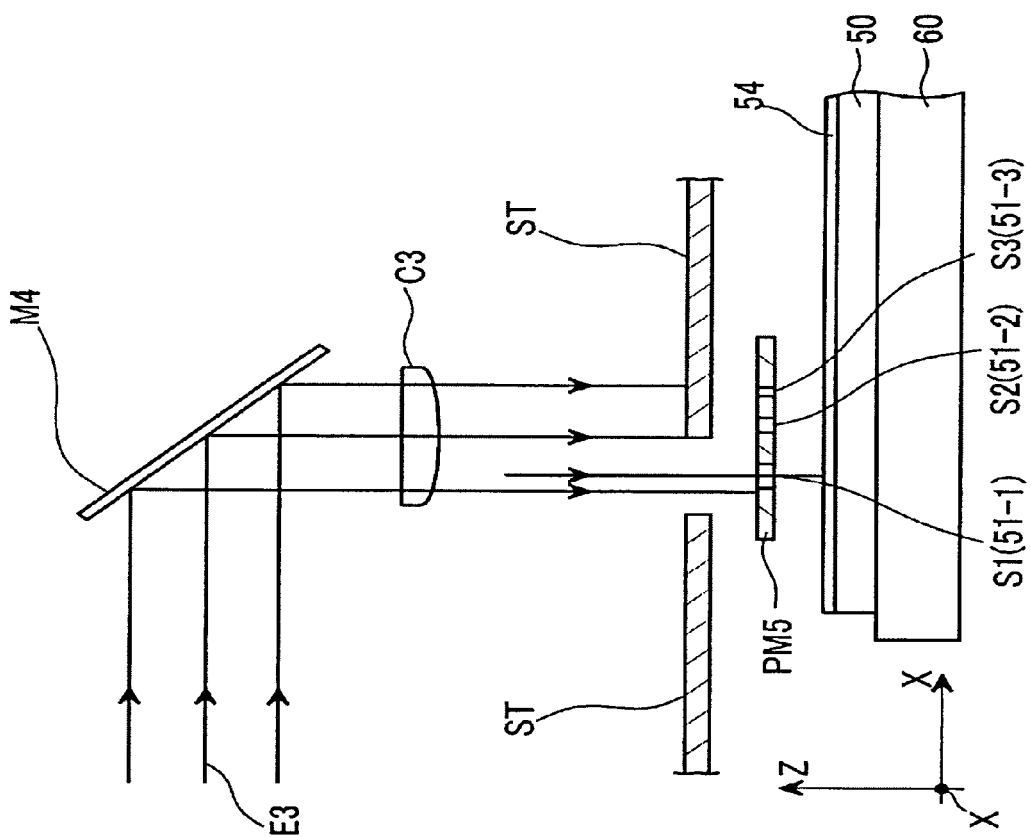
FIG. 6 is a schematic diagram illustrating an exposure device according to a third embodiment.
Figure 7:
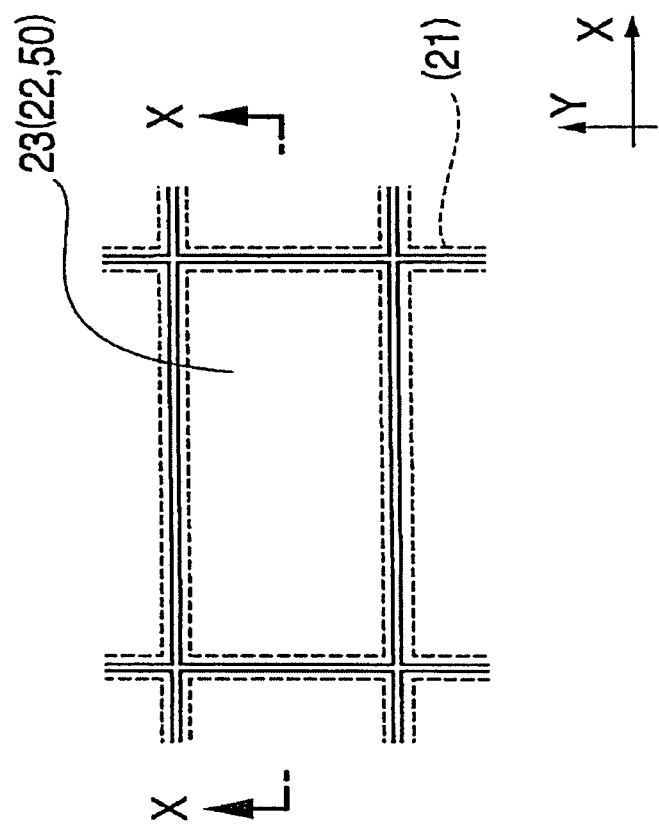
FIG. 7 is an enlarge view of pixels of a color filter.
Figure 8:
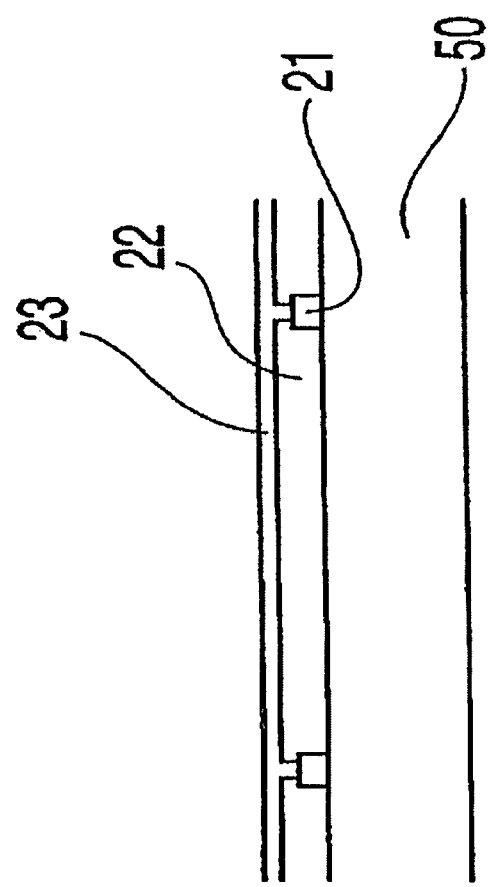
FIG. 8 is a cross-sectional view of the pixels of the color filter shown in FIG. 7, taken along a line X-X in FIG. 7.
Figure 9:
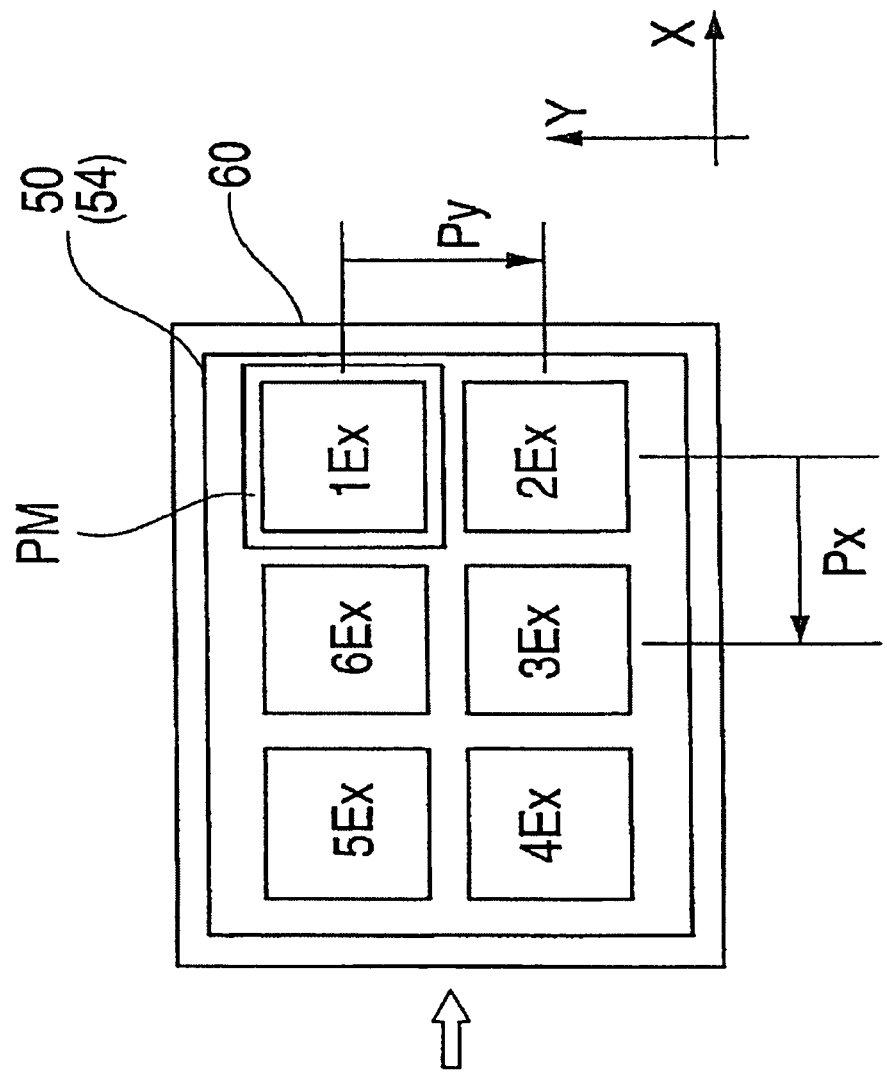
FIG. 9 is a plan view illustrating an example in which color filters are manufactured by the XY step exposure method.
Figure 10:
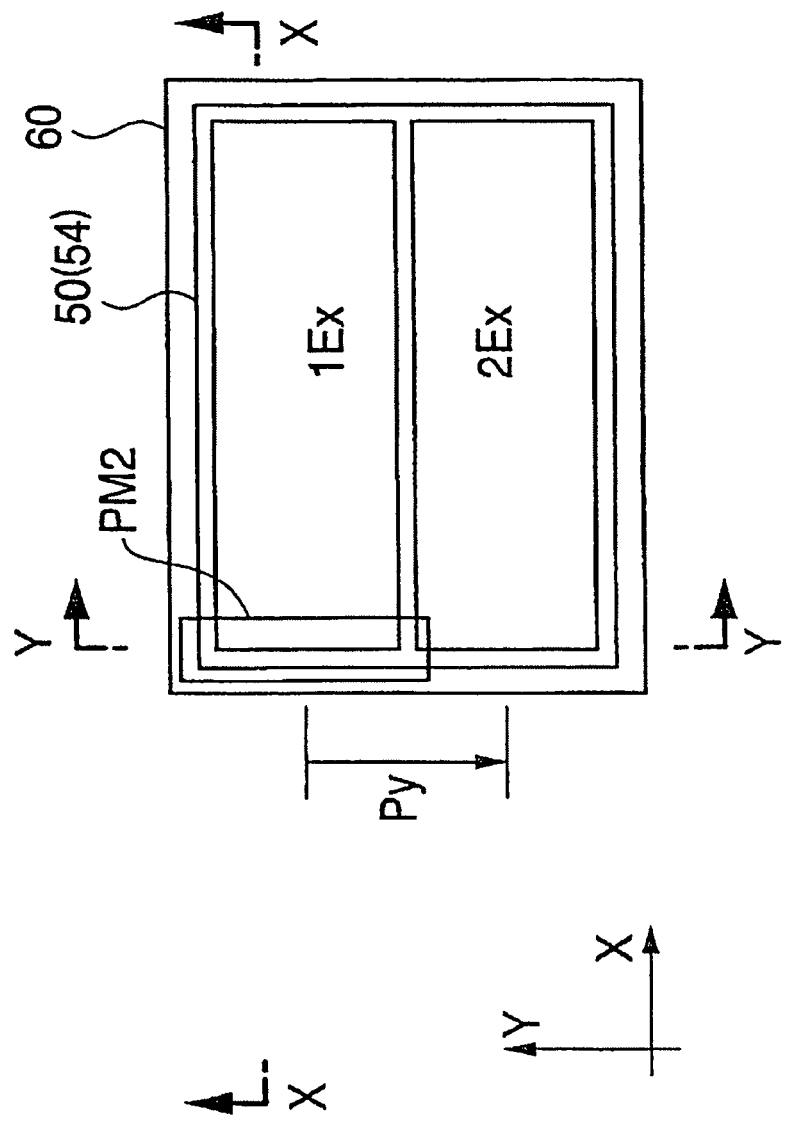
FIG. 10 is a plan view illustrating the slit exposure method.
Figure 11:
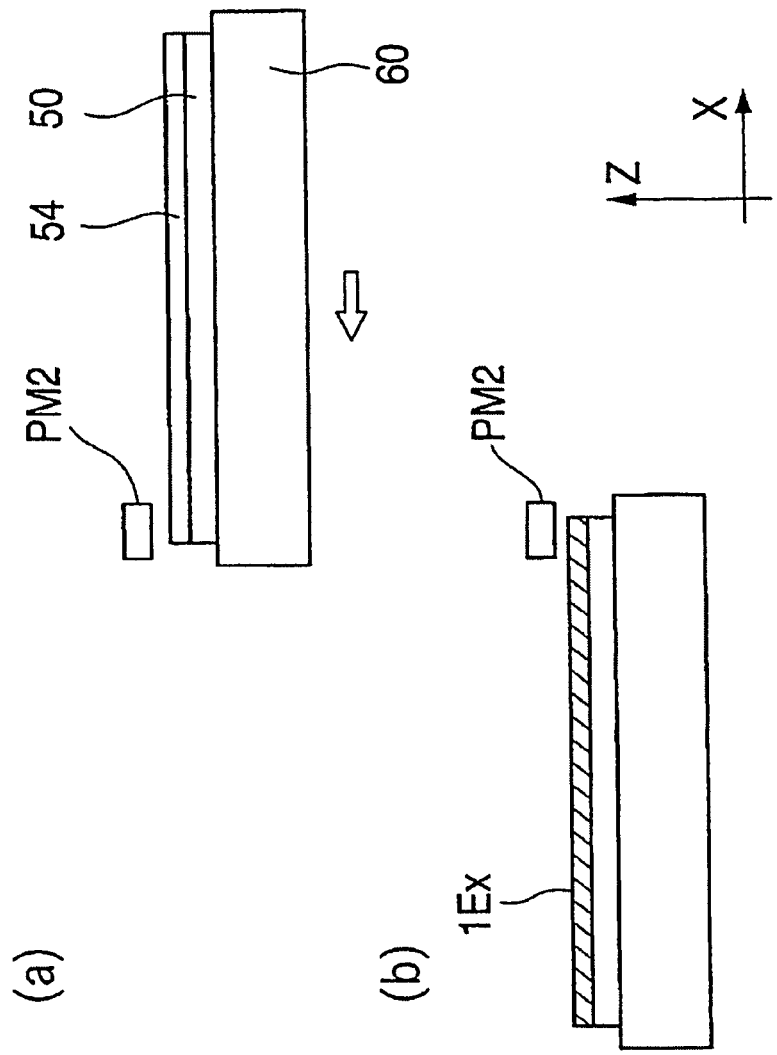
FIG. 11 is a cross-sectional view taken along a line X-X in FIG. 10.
Figure 12:
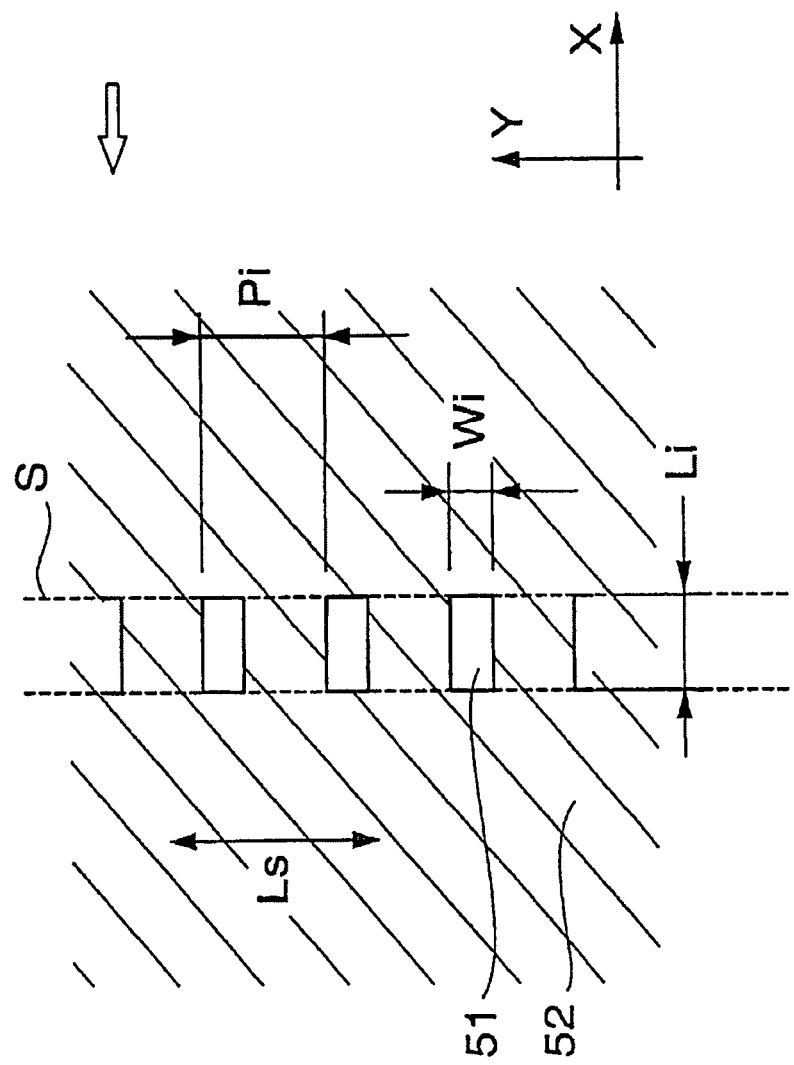
FIG. 12 is a partially enlarged view of a mask pattern of a photomask shown in FIG. 10.
Figure 13:
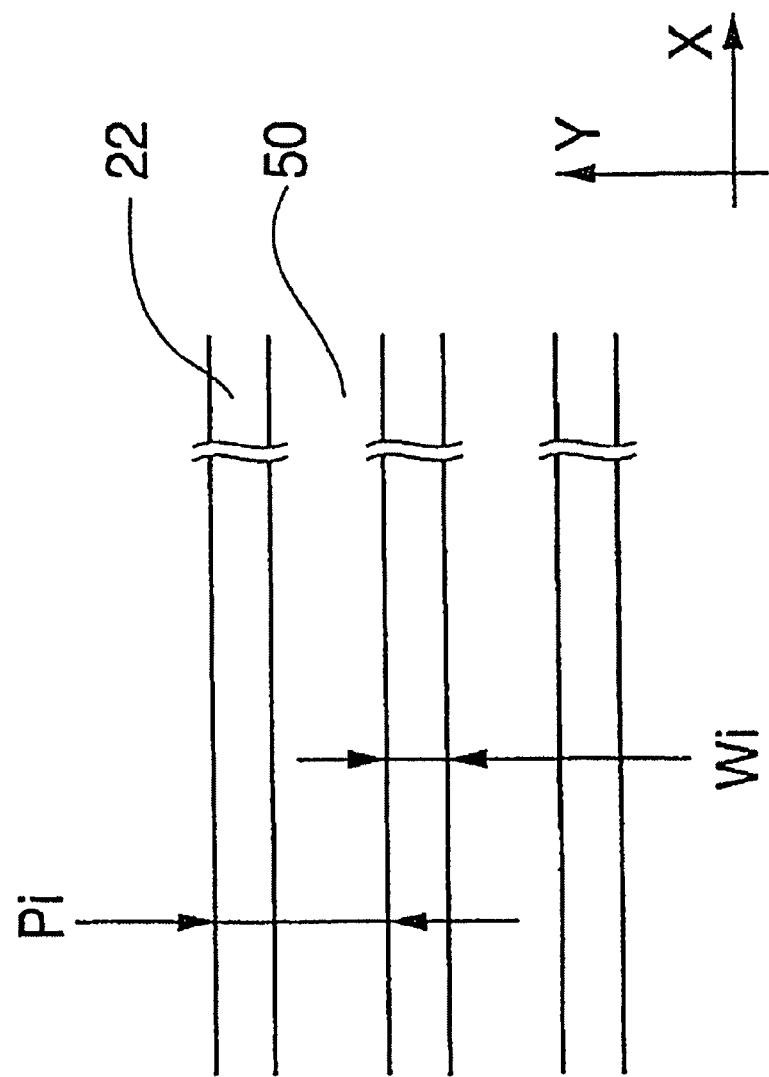
FIG. 13 is a partially enlarged view of stripe patterns exposed by the slit exposure method.
Figure 14:
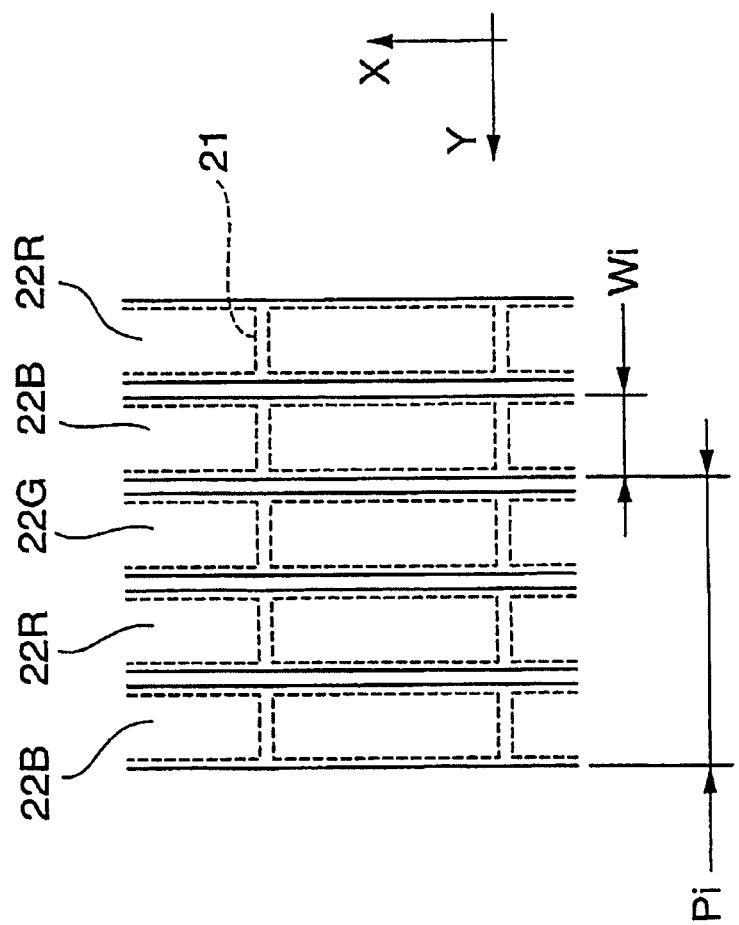
FIG. 14 is a partially enlarged view of a color filter manufactured by the slit exposure method.
Figure 15:
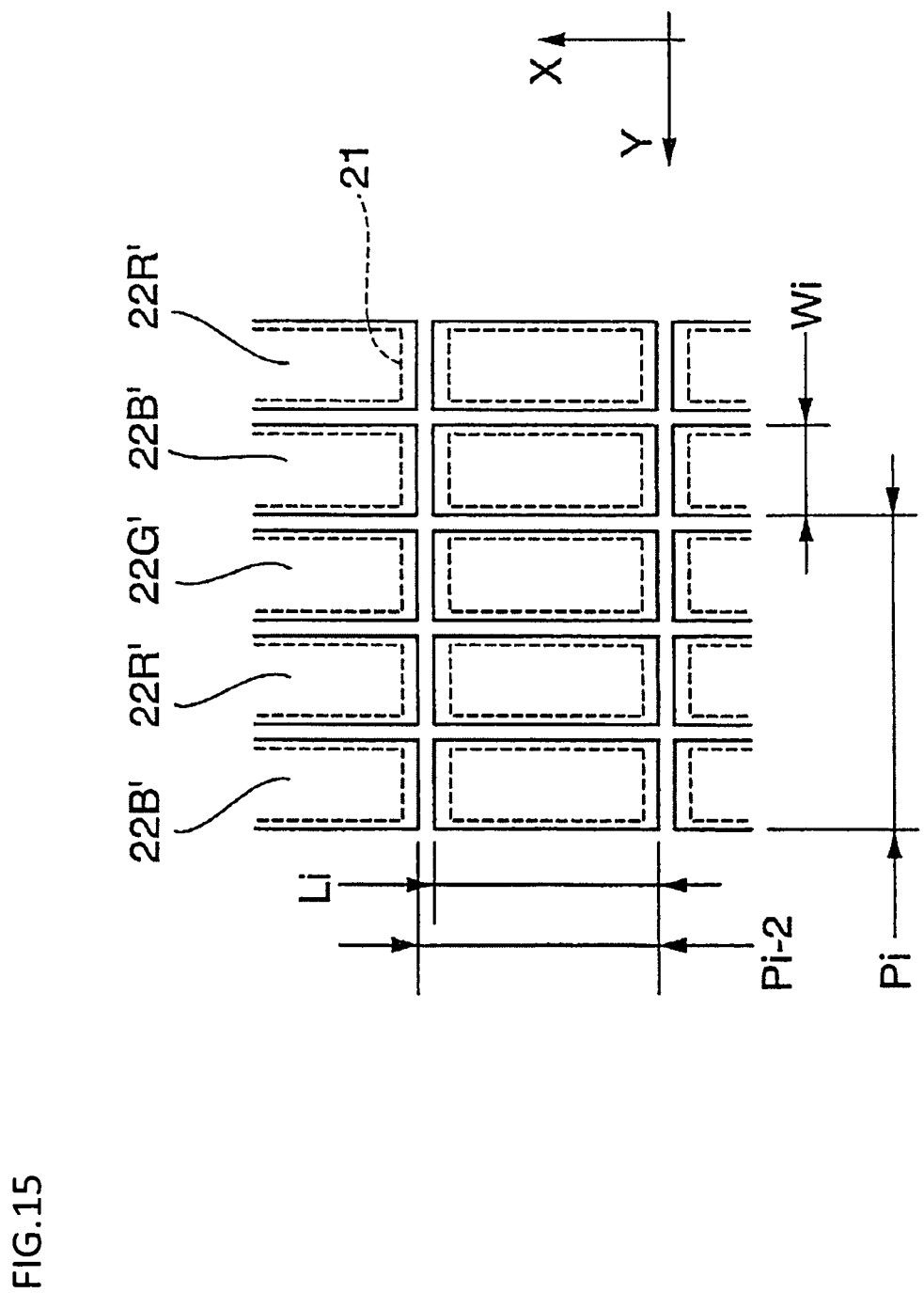
FIG. 15 is a partially enlarged view of a color filter manufactured by the pulsed light exposure method.
Figure 16:
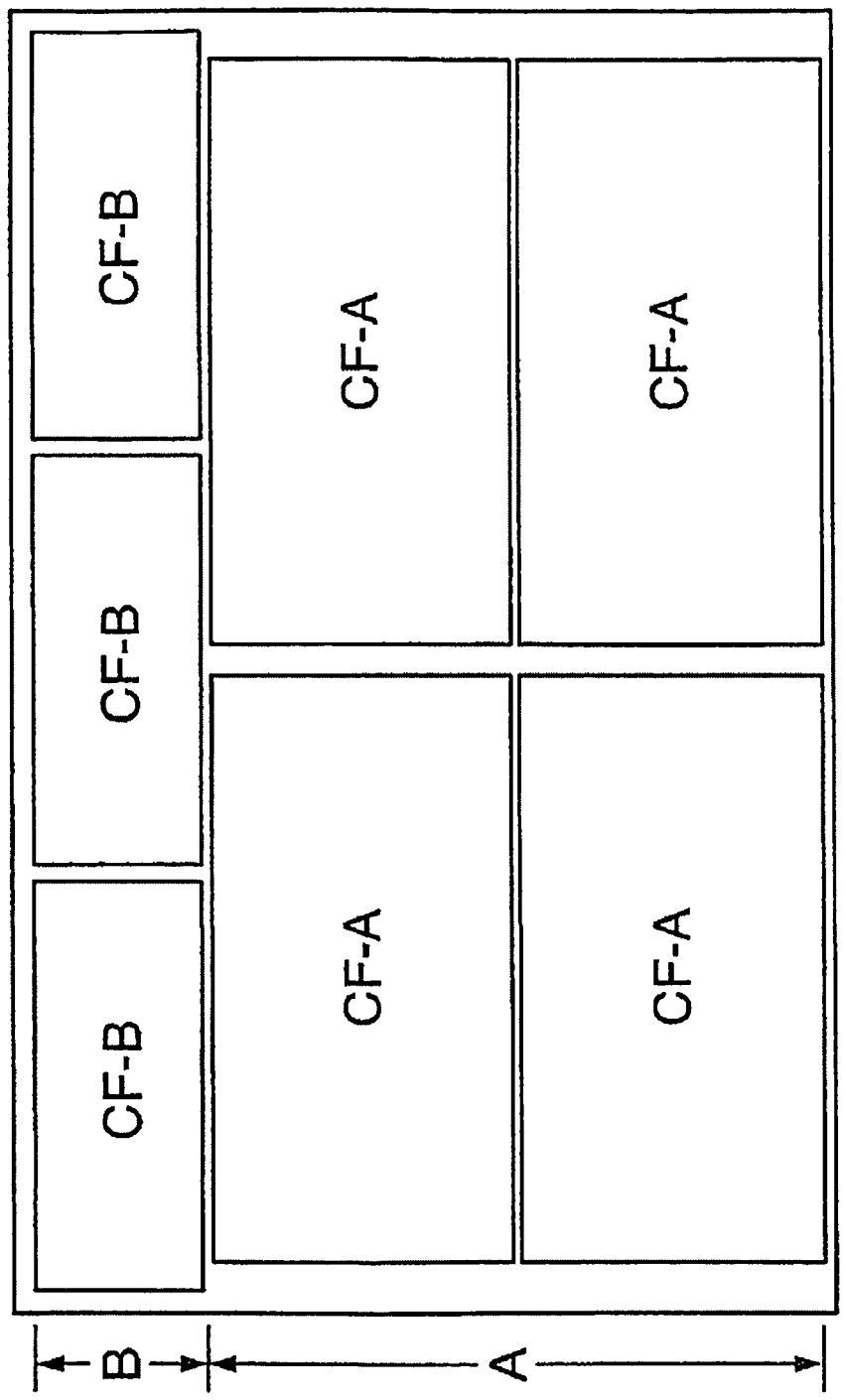
FIG. 16 is a plan view illustrating an example in which a plurality of types of color filters are formed on a single substrate.

FIG. 5 is a plan view illustrating an example in which three different types of color filters are formed on a single substrate, and FIG. 6 is a schematic diagram illustrating an exposure device according to the third embodiment. The third embodiment is different from the first embodiment in the number of types of color filters formed on a single substrate and in the photomask as a component of the exposure device. Here, descriptions of the same components as those of the first embodiment will be omitted.

As shown in FIG. 5, in the third embodiment, three different types of color filters are formed on a single substrate. Specifically, two first color filters CF-1 are formed in a region R1, three second color filters CF-2 are formed in a region R2, and four third color filters CF-3 are formed in a region R3. The first color filter CF-1, the second color filter CF-2, and the third color filter CF-3 are different from each other in at least one of the size and arrangement pitch of colored pixels, and the finished size.

As shown in FIG. 6, a photomask PM5 used in the exposure device of the present embodiment has three types of mask patterns, that is, a first slit S1 having an array of a plurality of openings 51-1, a second slit S2 having a plurality of openings 51-2, and a third slit S3 having a plurality of openings 51-3. The first slit S1, the second slit S2, and the third slit S3 are used for exposing a first region PR-1, a second region PR-2, and a third region PR-3, respectively.

The exposure device of the present embodiment has two shutters ST. The shutters ST shield, from light, the second slit S2 and the third slit S3 when exposing the first region PR-1, shield the first slit S1 and the third slit S3 when exposing the second region PR-2, and shield the first slit S1 and the second slit S2 when exposing the third region PR-3.

In this way, also when three different types of color filters are formed on a single substrate, it is possible to form different color filters in different regions of the substrate 50 by selectively directing a light beam from the light source to some of the mask patterns of the photomask PM5, without changing the positional relation between the photomask PM5 and the irradiation range of the light beam from the light source.

In this embodiment, the exposure device having the shutters ST as the selective irradiation mechanism has been described. However, instead of the shutters ST, a pair of mirrors M3 may be used as in the second embodiment.

Modifications

In the first to third embodiments, the examples of forming colored pixels constituting color filters have been described. However, the present invention is applicable to not only the pattern formation of color filters but also formations of various resist patterns.

Further, in the first to third embodiment, shutters or a pair of plane mirrors are used as examples of the selective irradiation mechanism. However, a prism or a mirror may be used solely or in combination.

Further, in the above-described embodiments, different two or three types of color filters are formed on a single substrate. However, the present invention can be similarly applied to formation of four or more types of color filters. Specifically, when forming different n types of color filters are formed in first to n-th regions (n: natural number not less than 2), n types of mask patterns (slits) are formed on a photomask, and a light beam is selectively directed to any of the mask patterns in accordance with the exposure target region.

Moreover, in the above-described embodiments, light-blocking sections and openings are formed in a photomask to form mask patterns (slits). However, the openings may transmit the entire incident light or a portion of incident light. That is, the openings may function as a transmission section that transmits at least a portion of incident light.

INDUSTRIAL APPLICABILITY

The present invention can be used for manufacturing color filters or the like to be used in liquid crystal display devices.

DESCRIPTION OF THE REFERENCE CHARACTERS 21 black matrix
22 colored pixel 23 transparent conductive film
30 photomask substrate
50 substrate
51, 51-1, 51-2, 51-3 opening
54 color resist
60 exposure stage
C, C2, C3 collimator lens
E, E2, E3 light beam
M, M2, M4 mirror
M3 a pair of mirrors
PM, PM2, PM3, PM4, PM5 photomask
PR-1 first region
PR-2 second region
PR-3 third region
R1, R2, R3 region
S1, S2, S3 first slit, second slit, third slit
ST shutter

The invention claimed is:

1. An exposure method for forming different resist patterns in a first region and a second region on a single substrate, the method comprising:
    fixing a photomask with respect to a light source, the photomask having a first mask pattern for exposing a portion of the resist pattern in the first region, and a second mask pattern for exposing a portion of the resist pattern in the second region;
    continuously or intermittently exposing the resist in the first region by selectively directing a light beam from the light source to the first mask pattern, while transferring the substrate; and
    continuously or intermittently exposing the resist in the second region by selectively directing the light beam from the light source to the second mask pattern, while transferring the substrate, wherein
    when exposing the resist in the second region, the light beam from the light source is deflected by a pair of mirrors to move the irradiation position of light on the photomask from the position where the first mask pattern is formed to the position where the second mask pattern is formed.

2. The exposure method according to claim 1, wherein the interval between a plurality of light transmitting sections which constitute the first pattern is different from the interval between a plurality of light transmitting sections which constitute the second pattern.

3. A color filter manufacturing method for forming different color filters in a first region and a second region on a single substrate, the method comprising:
    fixing a photomask with respect to a light source, the photomask having a first mask pattern for exposing a portion of colored pixels in the first region, and a second mask pattern for exposing a portion of colored pixels in the second region; and
    forming colored pixels of all colors, which constitute the color filters, by repeatedly performing a colored pattern formation process including: applying a color resist on the substrate; a continuously or intermittently exposing the color resist in the first region by selectively directing a light beam from the light source to the first mask pattern while transferring the substrate; and continuously or intermittently exposing the color resist in the second region by selectively directing the light beam from the light source to the second mask pattern while transferring the substrate, wherein
    when exposing the color resist in the second region, the light beam from the light source is deflected by a pair of mirrors to move the irradiation position of light on the photomask from the position where the first mask pattern is formed to the position where the second mask pattern is formed.

4. The color filter manufacturing method according to claim 3, wherein
    the size of the color filter formed in the first region is different from the size of the color filter formed in the second region, and the interval between a plurality of light transmitting sections which constitute the first mask pattern is different from the interval between a plurality of light transmitting sections which constitute the second mask pattern.

5. An exposure device for forming different resist patterns in a first region and a second region on a single substrate, the exposure device comprising:
    a light source;
    a photomask fixed with respect to the light source, the photomask having a first mask pattern to expose a portion of the resist pattern in the first region, and a second mask pattern for exposing a portion of the resist pattern in the second region;
    a substrate transfer device to transfer a substrate on which a resist is applied; and
    a selective irradiation mechanism to selectively direct a light beam from the light source to either of the mask patterns of the photomask, the selective irradiation mechanism being a pair of mirrors which deflect the light beam from the light source when exposing the resist in the second region, to move the irradiation position of light on the photomask from the position where the first mask pattern is formed to the position where the second mask pattern is formed.

* * * * *